(12) United States Patent
Lee et al.

(10) Patent No.: US 11,056,320 B2
(45) Date of Patent: Jul. 6, 2021

(54) SUBSTRATE TREATING APPARATUS, SUBSTRATE SUPPORT UNIT, AND SUBSTRATE TREATING METHOD

(71) Applicant: SEMES CO., LTD., Cheonan-si (KR)

(72) Inventors: Sang-Kee Lee, Cheonan-si (KR); Kang Rae Ha, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/653,626

(22) Filed: Oct. 15, 2019

(65) Prior Publication Data

US 2020/0118800 A1    Apr. 16, 2020

(30) Foreign Application Priority Data

Oct. 15, 2018 (KR) .......................... 10-2018-0122273

(51) Int. Cl.
*H01J 37/32* (2006.01)

(52) U.S. Cl.
CPC .. *H01J 37/32724* (2013.01); *H01J 37/32449* (2013.01); *H01J 37/32513* (2013.01); *H01J 37/3211* (2013.01); *H01J 37/32467* (2013.01); *H01J 37/32642* (2013.01); *H01J 2237/002* (2013.01); *H01J 2237/334* (2013.01)

(58) Field of Classification Search
CPC ...................... H01J 37/32724; H01L 21/3065
See application file for complete search history.

(56) References Cited

U.S. PATENT DOCUMENTS

2003/0168174 A1* 9/2003 Foree .................. C23C 16/4584
  156/345.51
2004/0115947 A1* 6/2004 Fink .................. H01L 21/67103
  438/716

FOREIGN PATENT DOCUMENTS

| KR | 10-2013-0019540 A | 2/2013 |
| KR | 10-2014-0118670 A | 10/2014 |
| KR | 10-2015-0003229 A | 1/2015 |

(Continued)

OTHER PUBLICATIONS

Office Action for related Korean Patent Application No. 10-2018-0122273 dated Oct. 17, 2019 in 6 pages.

(Continued)

*Primary Examiner* — Thomas T Pham
(74) *Attorney, Agent, or Firm* — Procopio, Cory, Hargreaves & Savitch LLP

(57) ABSTRACT

An apparatus comprises a housing having a process space, a support unit supporting the substrate in the process space, a process gas supply unit supplying a process gas into the process space, and a plasma source generating plasma from the process gas. The support unit comprises a support member on which the substrate is placed, a heating member that heats the substrate supported on the support member, and a heat transfer gas supply member that supplies a heat transfer gas to a backside of the substrate. The heating member comprises heaters that heat regions on the substrate on the support member viewed from above. The support member comprises a protrusion that partitions a space between the support member and the backside of the substrate placed on the support member into gas regions, and at least one of heating regions is divided into regions by the protrusion viewed from above.

15 Claims, 6 Drawing Sheets

(56) References Cited

FOREIGN PATENT DOCUMENTS

KR     10-1909190 B    12/2018
KR     10-2005843 B    10/2019

OTHER PUBLICATIONS

Notice of Allowance for related Korean Patent Application No. 10-2018-0122273 dated Apr. 1, 2020 in 5 pages.

* cited by examiner

SUBSTRATE TREATING APPARATUS, SUBSTRATE SUPPORT UNIT, AND SUBSTRATE TREATING METHOD

CROSS-REFERENCE TO RELATED APPLICATIONS

A claim for priority under 35 U.S.C. § 119 is made to Korean Patent Application No. 10-2018-0122273 filed on Oct. 15, 2018, in the Korean Intellectual Property Office, the entire contents of which are hereby incorporated by reference.

BACKGROUND

Embodiments of the inventive concept described herein relate to a substrate treating apparatus and a substrate treating method.

Plasma may be used in a substrate treating process. For example, plasma may be used in an etching, deposition, or dry cleaning process. Plasma is generated by heating a neutral gas to a very high temperature or subjecting it to a strong electric field or a radio frequency (RF) electromagnetic field and refers to an ionized gaseous state of matter containing ions, electrons, and radicals. A dry cleaning, ashing, or wear process using plasma is performed by allowing ions or radical particles contained in plasma to collide with a substrate.

In controlling the temperatures of respective regions of a substrate, it is advantageous to subdivide independently adjustable heating regions. However, to increase the number of heating regions, heater terminals and temperature sensors, in addition to heaters, have to be additionally provided. Accordingly, there is a limitation in subdividing the heating regions due to a space limitation in a substrate treating apparatus in which the components that have to be provided to increase the number of heating areas are arranged.

SUMMARY

Embodiments of the inventive concept provide a substrate treating apparatus for improving process efficiency in treating a substrate using plasma.

Embodiments of the inventive concept provide a substrate treating apparatus for further subdividing and heating a substrate.

Embodiments of the inventive concept provide a substrate treating apparatus for improving a temperature deviation using small heating regions.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a housing having a process space therein, a support unit that supports the substrate in the process space, a process gas supply unit that supplies a process gas into the process space, and a plasma source that generates plasma from the process gas. The support unit includes a support member on which the substrate is placed, a heating member that heats the substrate supported on the support member, and a heat transfer gas supply member that supplies a heat transfer gas to a backside of the substrate supported on the support member. The heating member includes a plurality of heaters, and the plurality of heaters heat different regions on the substrate placed on the support member when viewed from above. The support member includes a protrusion that partitions a space between the support member and the backside of the substrate placed on the support member into a plurality of gas regions, and at least one of heating regions on the substrate heated by the heating member is divided into a plurality of regions by the protrusion when viewed from above.

In an embodiment, pressures of the heat transfer gas supplied into the plurality of gas regions may be independently adjustable.

In an embodiment, the heat transfer gas supply member may include a heat transfer gas supply source, a main supply line connected to the heat transfer gas supply source, a plurality of supply channels branching off from the main supply line, each of which is connected to a corresponding one of the plurality of gas regions, and flow rate adjustment members installed in the respective supply channels, in which each of the flow rate adjustment members adjusts a flow rate of the heat transfer gas flowing through the corresponding supply channel.

In an embodiment, outputs of the plurality of heaters may be independently controllable.

In an embodiment, the protrusion may have a ring shape.

In an embodiment, some of the plurality of heating regions may be at different distances from the center of the support member.

In an embodiment, the heating region divided into the plurality of regions by the protrusion when viewed from above may be a heating region located farthest from the center of the support member among the plurality of heating regions.

In an embodiment, the plurality of heating regions may include a first heating region including an edge region of the support member and a second heating region including a central region of the support member. The heating region divided into the plurality of regions by the protrusion when viewed from above may be the first heating region.

In an embodiment, the first heating region may include a plurality of first heating regions, and the plurality of first heating regions may be arranged along a circumferential direction of the substrate.

In an embodiment, the plurality of heating regions may further include a third heating region disposed between the first heating region and the second heating region.

In an embodiment, the first heating region may have a larger width along a radial direction of the substrate than the second heating region.

In an embodiment, the plurality of heating regions may include a central gas region including part of the first heating region and part of the second heating region and an edge gas region including another part of the first heating region.

According to an exemplary embodiment, a support unit for supporting a substrate includes a support member on which the substrate is placed, a heating member that heats the substrate supported on the support member, and a heat transfer gas supply member that supplies a heat transfer gas to a backside of the substrate supported on the support member. The heating member includes a plurality of heaters, and the plurality of heaters heat different regions on the substrate placed on the support member when viewed from above. The support member includes a protrusion that partitions a space between the support member and the backside of the substrate placed on the support member into a plurality of gas regions, and at least one of heating regions on the substrate heated by the heating member is divided into a plurality of regions by the protrusion when viewed from above.

In an embodiment, the plurality of heating regions may include a first heating region including an edge region of the support member and a second heating region including a central region of the support member. The heating region divided into the plurality of regions by the protrusion when viewed from above may be the first heating region.

In an embodiment, the plurality of heating regions may include a central gas region including part of the first heating region and part of the second heating region and an edge gas region including another part of the first heating region.

According to an exemplary embodiment, a method for treating a substrate includes controlling temperature of the substrate while treating the substrate using plasma. The controlling of the temperature of the substrate is performed by partitioning the substrate into a plurality of heating regions, independently heating the heating regions using heaters provided for the respective heating regions, partitioning a space under the substrate into a plurality of gas regions, and independently supplying a heat transfer gas into the plurality of gas regions. At least one of the plurality of heating regions is superimposed on the plurality of gas regions when viewed from above.

In an embodiment, pressures of the heat transfer gas supplied into the plurality of gas regions may differ from one another.

In an embodiment, among the plurality of heating regions, the heating region superimposed on the plurality of gas regions when viewed from above may be the outermost heating region.

According to an exemplary embodiment, a method for treating a substrate includes controlling temperature of the substrate while treating the substrate using plasma. The controlling of the temperature of the substrate is performed by partitioning the substrate into a plurality of heating regions, independently heating the heating regions using heaters for the respective heating regions, and differentiating pressures of a heat transfer gas supplied into one section and another section in at least one of the plurality of heating regions.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
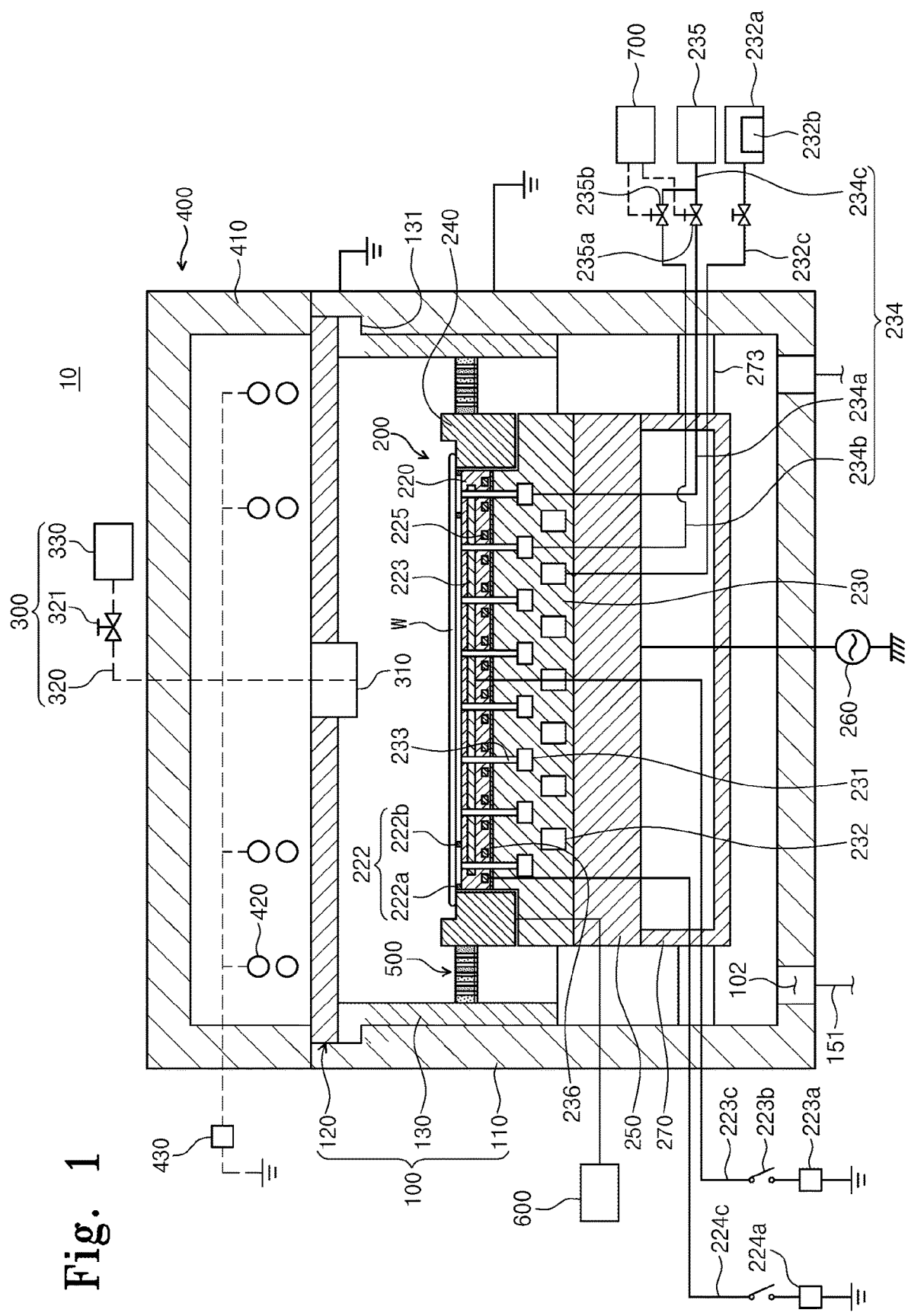
FIG. 1 is a sectional view illustrating a substrate treating apparatus according to an embodiment of the inventive concept.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

A substrate treating apparatus for etching a substrate using plasma will be described in an embodiment of the inventive concept. Without being limited thereto, however, the inventive concept is applicable to various types of apparatuses for performing a process by supplying plasma into a chamber.

FIG. 1 is a sectional view illustrating a substrate treating apparatus according to an embodiment of the inventive concept.

Referring to FIG. 1, the substrate treating apparatus 10 treats a substrate W by using plasma. For example, the substrate treating apparatus 10 may perform an etching process on the substrate W. The substrate treating apparatus 10 includes a chamber 100, a support unit 200, a process gas supply unit 300, a plasma source 400, and an exhaust baffle 500.

The chamber 100 has a space in which a substrate treating process is performed. The chamber 100 includes a housing 110, a dielectric cover 120, and a liner 130.

The housing 110 is open at the top and has a process space therein. The process space is a space in which the substrate treating process is performed. The housing 110 is formed of a metal material. The housing 110 may be formed of an aluminum material. The housing 110 may be grounded.

The housing 110 has an exhaust hole 102 formed in the bottom thereof. The exhaust hole 102 is connected with an exhaust line 151. Reaction byproducts generated during the substrate treating process and gases staying in the interior space of the housing 110 may be discharged to the outside through the exhaust line 151. The pressure in the housing 110 is reduced to a predetermined pressure by the exhaust process.

The dielectric cover 120 covers the open top of the housing 110. The dielectric cover 120 has a plate shape and seals the interior space of the housing 110. The dielectric cover 120 may be provided so as to be removable. According to an embodiment of the inventive concept, the dielectric cover 120 has a fluid channel 611 formed therein. Furthermore, the dielectric cover 120 may include a plurality of dielectric plates.

The liner 130 is provided inside the housing 110. The liner 130 has a space formed therein, which is open at the top and the bottom. The liner 130 may have a cylindrical shape. The liner 130 may have a radius corresponding to that of the inner side of the housing 110. The liner 130 is provided along the inner side of the housing 110. A support ring 131 is formed on an upper end of the liner 130. The support ring 131 is implemented with a plate in a ring shape and protrudes outside the liner 130 along the periphery of the liner 130. The support ring 131 is placed on an upper end of the housing 110 and supports the liner 130. The liner 130 may be formed of the same material as that of the housing 110. The liner 130 may be formed of an aluminum material. The liner 130 protects the inner side of the housing 110.

The support unit 200 is located in the process space of the chamber 100. The support unit 200 supports the substrate W. The support unit 200 may include a support member 210 that electro-statically clamps the substrate W using an electrostatic force. Alternatively, the support unit 200 may support the substrate W in various manners such as mechanical clamping. Hereinafter, the support unit 200 including the support member 210 will be described.

The support unit 200 includes the support member 210, an insulating plate 250, and a lower cover 270. The support unit 200 is located in the chamber 100 and is spaced apart upward from the bottom of the housing 110.

The support member 210 is implemented with an electrostatic chuck that includes a dielectric plate 220, a chucking electrode 223, a heating member 225, a base plate 230, and a focus ring 240.

The dielectric plate 220 is located at the top of the support member 210. The dielectric plate 220 is formed of a dielectric substance in a circular plate shape. The substrate W is placed on the top side of the dielectric plate 220.

The dielectric plate 220 has a first supply channel 211 formed therein. The first supply channel 211 extends from the top side of the dielectric plate 210 to the bottom side thereof. A plurality of first supply channels 211 are formed to be spaced apart from each other and serve as passages through which a heat transfer gas is supplied to the backside of the substrate W as a heat transfer fluid.

The dielectric plate 220 has a protrusion 222 formed on the top side thereof. The protrusion 222 partitions the space between the support member 210 and the backside of the substrate W placed on the support member 210 into a plurality of gas regions. The protrusion 222 restricts a movement of the heat transfer gas such that the heat transfer gas supplied between the support member 210 and the substrate W supported on the support member 210 is confined in the gas regions. The protrusion 222 will be described below in detail with reference to FIGS. 2 to 5.

The chucking electrode 223 and the heating member 225 are buried in the dielectric plate 220. The chucking electrode 223 is located above the heating member 225. The chucking electrode 223 is electrically connected with a first lower power supply 223a. The first lower power supply 223a includes a direct current (DC) power supply.

A switch 223b is installed between the chucking electrode 223 and the first lower power supply 223a. The chucking electrode 223 may be electrically connected with, or disconnected from, the first lower power supply 223a by turning on or off the switch 223b. When the switch 223b is turned on, DC current is applied to the chucking electrode 223. The current applied to the chucking electrode 223 induces an electrostatic force between the chucking electrode 223 and the substrate W, and the substrate W is clamped to the dielectric plate 220 by the electrostatic force.

The heating member 225 is electrically connected with a second lower power supply 224a. The heating member 225 resists electric current applied by the second lower power supply 224a, thereby generating heat. The generated heat is transferred to the substrate W through the dielectric plate 220. The substrate W is maintained at a predetermined temperature by the heat generated from the heating member 225. The heating member 225 includes a spiral coil. The heating member 225 will be described below in detail with reference to FIG. 4.

The base plate 230 is located below the dielectric plate 220. The bottom side of the dielectric plate 220 and the top side of the base plate 230 may be bonded together by an adhesive layer 236. The base plate 230 may be formed of an aluminum material. The top side of the base plate 230 may have a step such that the central region of the top side is located in a higher position than the edge region of the top side. The central region of the top side of the base plate 230 has an area corresponding to that of the bottom side of the dielectric plate 220 and is bonded to the bottom side of the dielectric plate 220. The base plate 230 has a circulation channel 231, a cooling channel 232, and a second supply channel 233 formed therein. The base plate 230 may be connected with a radio frequency (RF) power supply 260 located outside, or may be grounded. The RF power supply 260 may apply power to the base plate 230 and may control ion energy incident on the substrate W. The base plate 230 may be formed of a metal material.

The circulation channel 231 serves as a passage through which the heat transfer fluid circulates. The circulation channel 231 may be formed in a spiral shape in the base plate 230. Alternatively, the circulation channel 231 may include ring-shaped circulation channels that have different radii and that are arranged to have the same center. The ring-shaped circulation channels may be connected together. The ring-shaped circulation channels are formed at the same height. The circulation channel 231 will be described below in detail with reference to FIG. 2.

The cooling channel 232 serves as a passage through which a cooling fluid circulates. The cooling channel 232 may be formed in a spiral shape in the base plate 230. Alternatively, the cooling channel 232 may include ring-shaped cooling channels that have different radii and that are arranged to have the same center. The ring-shaped cooling channels may be connected together. The ring-shaped cooling channels may have a larger cross-sectional area than the circulation channel 231. The ring-shaped cooling channels are formed at the same height. The cooling channel 232 may be located below the circulation channel 231.

The second supply channel 233 extends upward from the circulation channel 231 to the top side of the base plate 230. As many second supply channels 233 as the first supply channels 211 are provided. The second supply channels 233 connect the circulation channel 231 and the first supply channels 211.

The circulation channel 231 is connected with a heat transfer gas supply source 235 through a heat transfer gas supply line 234. The heat transfer gas supply source 235 has a heat transfer fluid stored therein. The heat transfer fluid includes an inert gas. According to an embodiment, the heat transfer fluid includes a helium (He) gas. The helium gas is supplied into the circulation channel 231 through the heat transfer gas supply line 234 and then supplied to the backside of the substrate W through the second supply channels 233 and the first supply channels 211 in a serial order. The helium gas serves as a medium through which heat transferred from plasma to the substrate W is transferred to the support member 210.

The cooling channel 232 is connected with a cooling fluid supply source 232a through a cooling fluid supply line 232c. The cooling fluid supply source 232a has a cooling fluid stored therein. A cooler 232b may be provided in the cooling fluid supply source 232a. The cooler 232b cools the cooling fluid to a predetermined temperature. Alternatively, the cooler 232b may be installed on the cooling fluid supply line 232c. The cooling fluid supplied to the cooling channel 232 through the cooling fluid supply line 232c cools the base plate 230 while circulating through the circulation channel 232. The base plate 230, while being cooled, cools the dielectric plate 220 and the substrate W together, thereby maintaining the substrate W at a predetermined temperature.

The focus ring 240 is disposed on the edge region of the support member 210. The focus ring 240 has a ring shape and is disposed around the dielectric plate 220. The top side of the focus ring 240 may have a step such that an outer portion 240a is located in a higher position than an inner portion 240b. The inner portion 240b of the top side of the focus ring 240 is located at the same height as the top side of the dielectric plate 220. The focus ring 240 surrounds the edge region of the substrate W located on the top side of the dielectric plate 220. The focus ring 240 allows plasma to be concentrated on the region opposite the substrate W in the chamber 100.

The insulating plate 250 is located under the base plate 230. The insulating plate 250 has a cross-sectional area corresponding to that of the base plate 230. The insulating plate 250 is located between the base plate 230 and the lower cover 270. The insulating plate 250 is formed of an insulating material and electrically insulates the base plate 230 and the lower cover 270.

The lower cover 270 is located at the bottom of the support unit 200. The lower cover 270 is spaced apart upward from the bottom of the housing 110. The lower cover 270 has a space formed therein, which is open at the top. The open top of the lower cover 270 is covered with the insulating plate 250. Accordingly, the outer diameter of the cross-section of the lower cover 270 may be the same as the outer diameter of the insulating plate 250. The lower cover 270 may have, in the interior space thereof, a lift pin module (not illustrated) that moves the transferred substrate W from an external transfer member to the support member 210.

The lower cover 270 has a connecting member 273. The connecting member 273 connects the outer side of the lower cover 270 and the inner wall of the housing 110. A plurality of connecting members 273 may be provided on the outer side of the lower cover 270 at predetermined intervals. The connecting member 273 supports the support unit 200 in the chamber 100. Furthermore, the connecting member 273 is connected to the inner wall of the housing 110 to allow the lower cover 270 to be electrically grounded. A first power line 223c connected with the first lower power supply 223a, a second power line 224c connected with the second lower power supply 224a, the heat transfer gas supply line 234 connected with the heat transfer gas supply source 235, and the cooling fluid supply line 232c connected with the cooling fluid supply source 232a extend into the lower cover 270 through the interior space of the connecting member 273.

The process gas supply unit 300 supplies a process gas into the process space of the chamber 100. The process gas supply unit 300 includes a process gas supply nozzle 310, a process gas supply line 320, and a process gas supply source 330. The process gas supply nozzle 310 is installed in the center of the dielectric cover 120. The process gas supply nozzle 310 has an injection hole formed in the bottom thereof. The injection hole is located below the dielectric cover 120 and supplies the process gas into the process space of the chamber 100. The process gas supply line 320 connects the process gas supply nozzle 310 and the process gas supply source 330. The process gas supply line 320 supplies the process gas stored in the process gas supply source 330 to the process gas supply nozzle 310. A valve 321 is installed in the process gas supply line 320. The valve 321 opens or closes the process gas supply line 320 and adjusts the amount of the process gas supplied through the process gas supply line 320.

The plasma source 400 excites the process gas supplied into the process space of the chamber 100 into plasma. An inductively coupled plasma (ICP) source may be used as the plasma source 400. The plasma source 400 includes an antenna room 410, an antenna 420, and a plasma power supply 430. The antenna room 410 has a cylindrical shape that is open at the bottom. The antenna room 410 has a space therein. The antenna room 410 has a diameter corresponding to that of the chamber 100. A lower end of the antenna room 410 is attachable to and detachable from the dielectric cover 120. The antenna 420 is disposed inside the antenna room 410. The antenna 420 is implemented with a helical coil wound a plurality of times and is connected with the plasma power supply 430. The antenna 420 receives power from the plasma power supply 430. The plasma power supply 430 may be located outside the chamber 100. The antenna 420 to which the power is applied may generate an electromagnetic field in the process space of the chamber 100. The process gas is excited into plasma by the electromagnetic field.

The exhaust baffle 500 is located between the inner wall of the housing 110 and the support member 210. The exhaust baffle 500 has through-holes 511 formed therein. The exhaust baffle 500 has an annular ring shape. The process gas supplied into the housing 110 passes through the through-holes 511 of the exhaust baffle 500 and is discharged through the exhaust hole 102. The flow of the process gas may be controlled depending on the shape of the exhaust baffle 500 and the shape of the through-holes 511.

Figure 2:
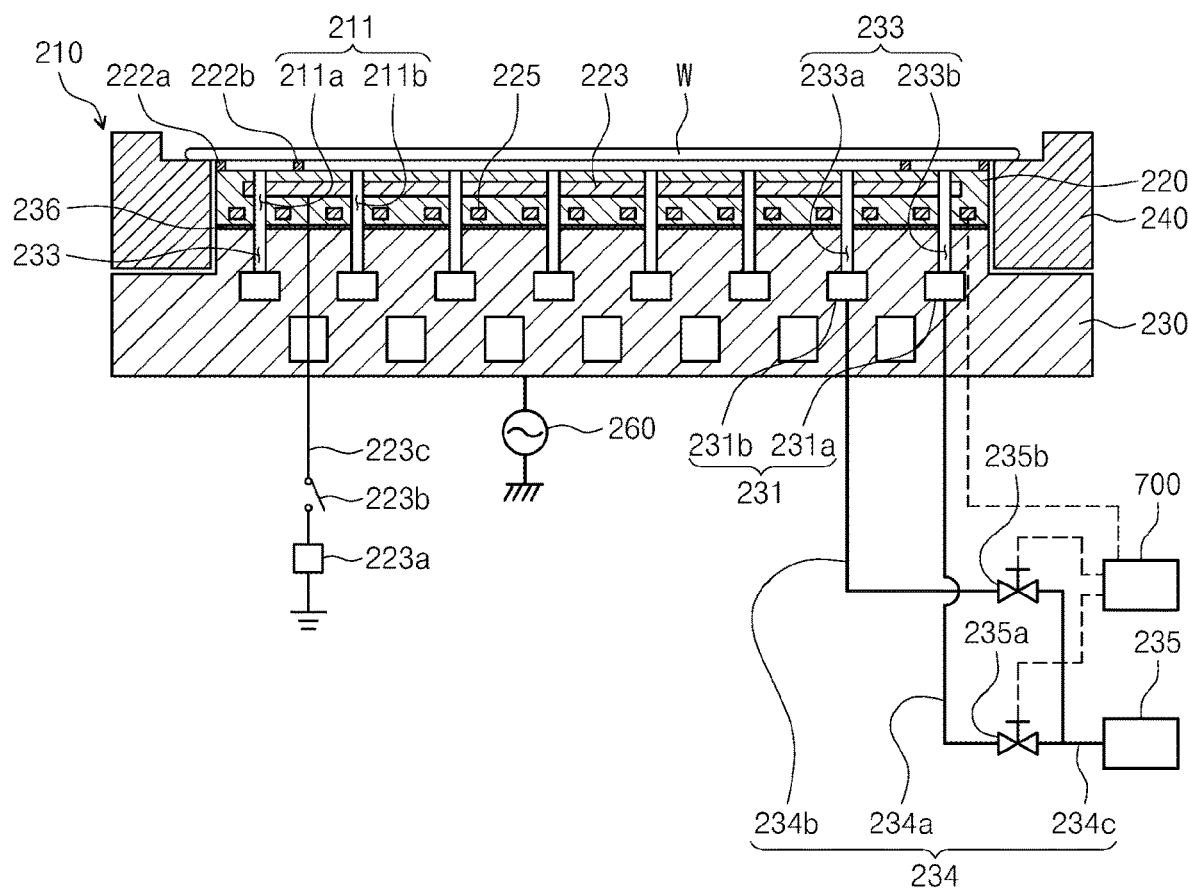
FIG. 2 is a schematic sectional view illustrating a support unit for supporting a substrate according to an embodiment of the inventive concept.
Figure 3:
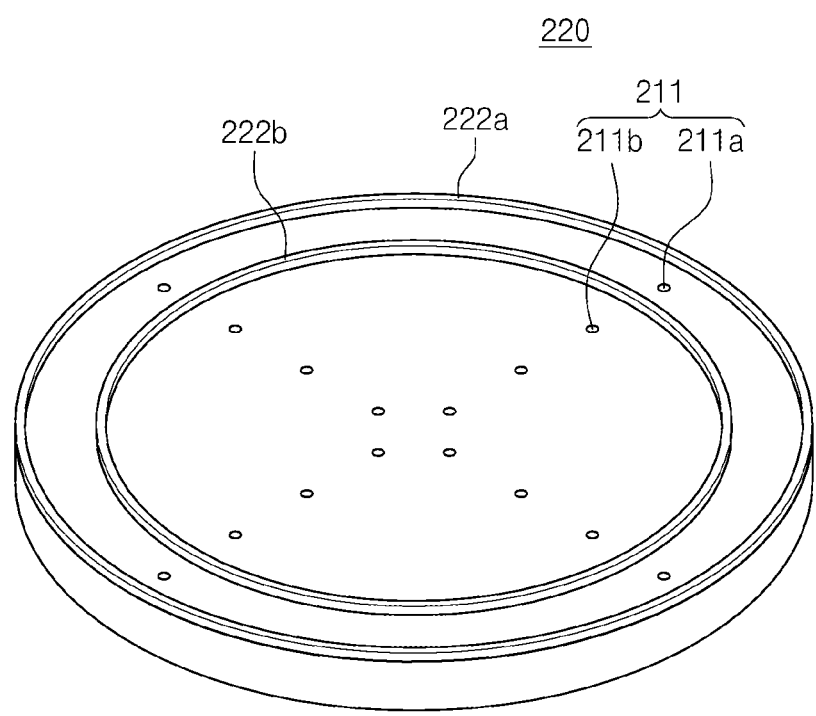
FIG. 3 is a perspective view illustrating a dielectric plate according to an embodiment of the inventive concept.
Figure 4:
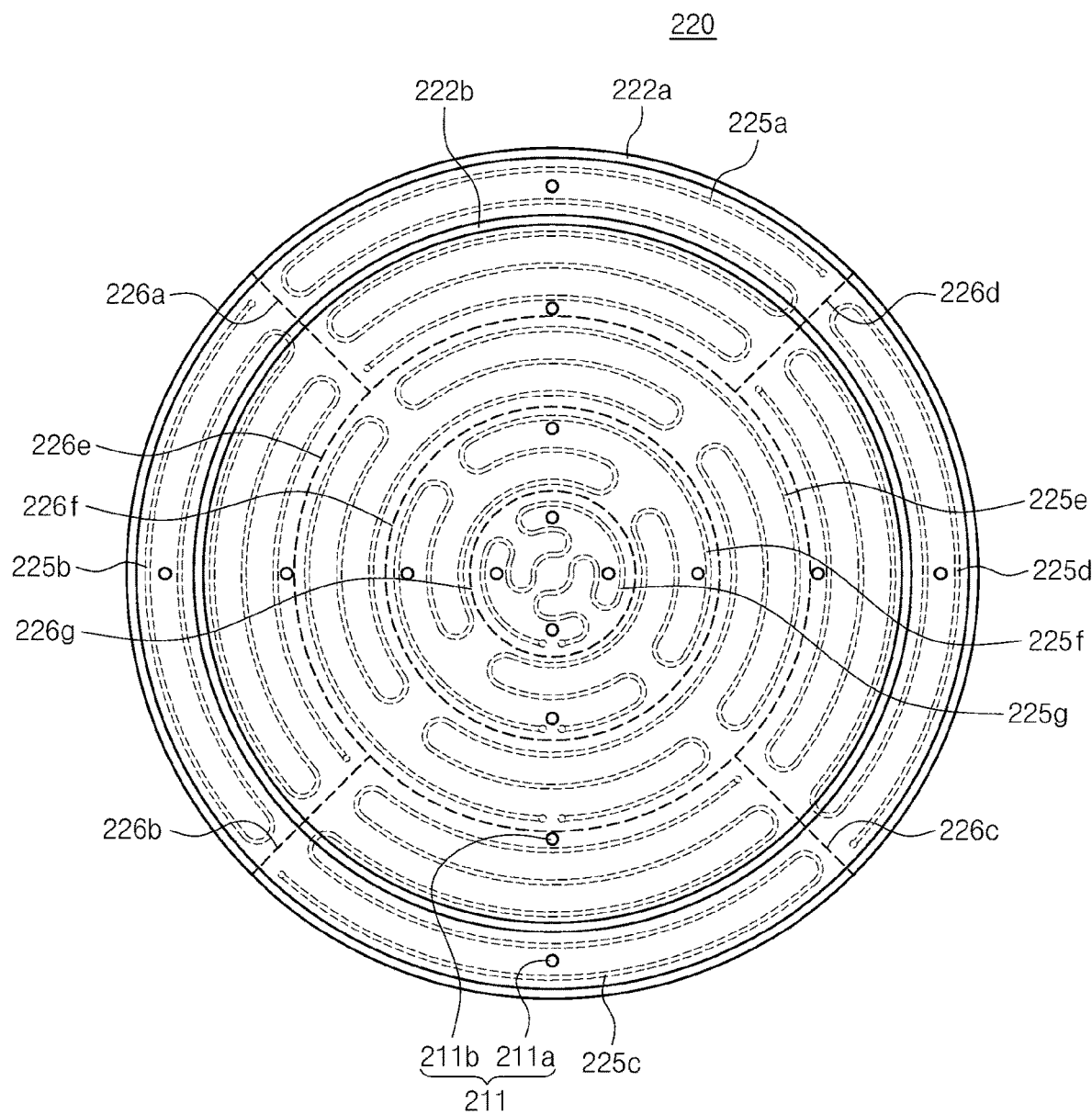
FIG. 4 is a plan view illustrating the dielectric plate in which a heating member is arranged, according to an embodiment of the inventive concept.
Figure 5:
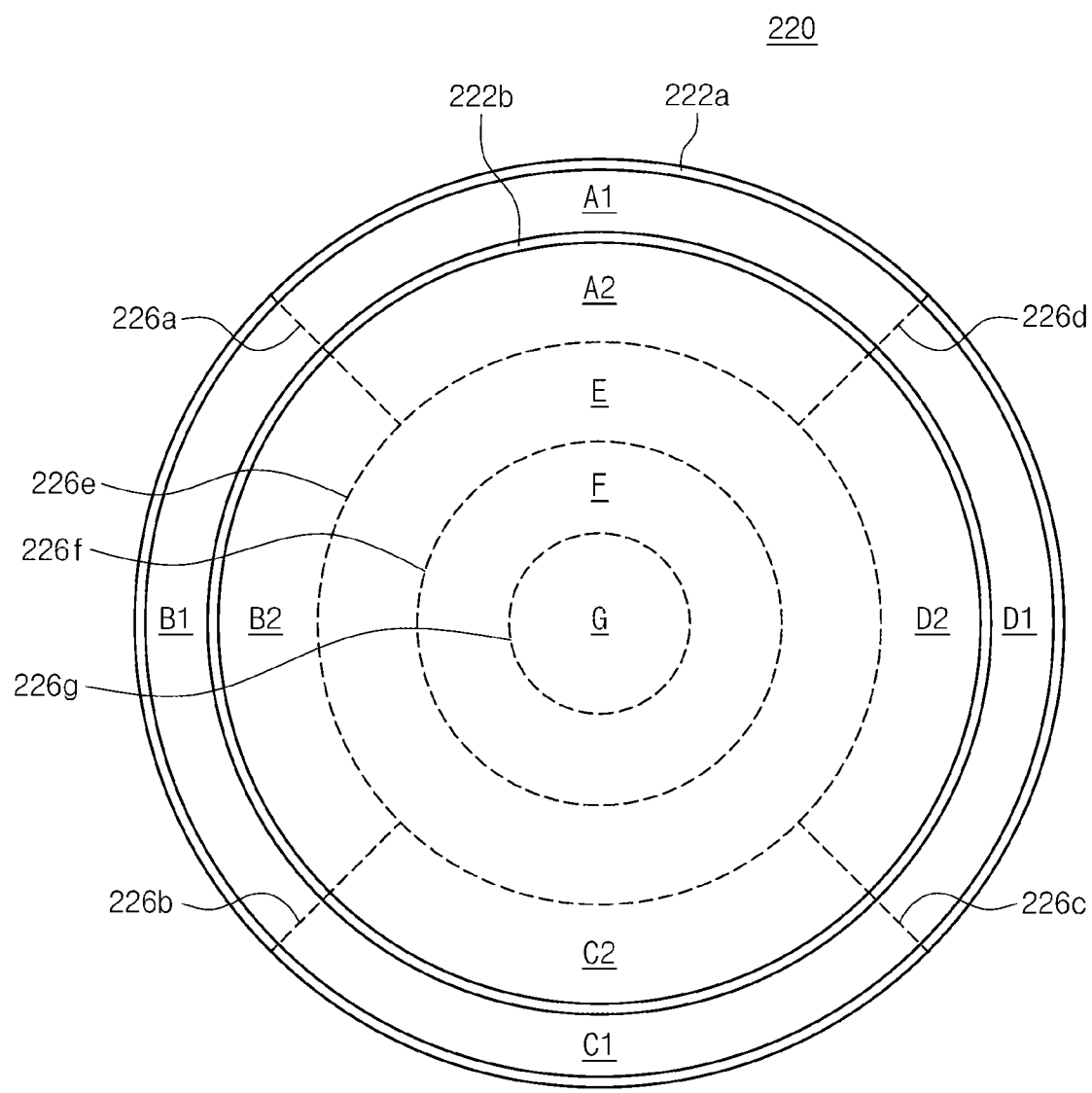
FIG. 5 is a view illustrating temperature control regions of a support member according to the embodiment of FIG. 4.

FIG. 2 is a schematic sectional view illustrating the support unit 200 for supporting a substrate according to an embodiment of the inventive concept. FIG. 3 is a perspective view illustrating the dielectric plate 220 according to an embodiment of the inventive concept. FIG. 4 is a plan view illustrating the dielectric plate 220 in which the heating member 225 is arranged, according to an embodiment of the inventive concept. FIG. 5 is a view illustrating temperature control regions of the support member 210 according to the embodiment of FIG. 4.

First, a heat transfer gas supply member according to an embodiment will be described with reference to FIGS. 2 and 3.

The space between the support member 210 and the backside of the substrate W placed on the support member 210 is partitioned into a plurality of gas regions with respect to the protrusion 222. According to an embodiment, the protrusion 222 includes a first protrusion 222a and a second protrusion 222b. The first protrusion 222a is provided in a ring shape on the edge of the dielectric plate 220. The second protrusion 222b has a ring shape with a smaller diameter than the first protrusion 222a and is provided on one region of the top side of the dielectric plate 220. The first protrusion 222a and the second protrusion 222b are radially arranged.

A first gas region (A1, B1, C1, and D1 of FIG. 5) that includes the edge region of the substrate W is outward of the second protrusion 222b. A second gas region (A2, B2, C2, D2, E, F, and G of FIG. 5) that includes the central region of the substrate W is inward of the second protrusion 222b.

A first supply channel 211a of the first gas region that is located in the first gas region, a second supply channel 233a of the first gas region, and a circulation channel 231a of the first gas region are connected to a first supply line 234a. The second supply channel 233a of the first gas region that is in communication with the first supply channel 211a of the first gas region is connected with the circulation channel 231a of the first gas region. The circulation channel 231a of the first gas region is connected to the first supply line 234a.

A first supply channel 211b of the second gas region that is located in the second gas region, a second supply channel 233b of the second gas region, and a circulation channel 231b of the second gas region are connected to a second supply line 234b. The second supply channel 233b of the second gas region that is in communication with the first supply channel 211b of the second gas region is connected with the circulation channel 231b of the second gas region. The circulation channel 231b of the second gas region that has a fluid channel independent of the circulation channel 231a of the first gas region is connected to the second supply line 234b.

The first supply line 234a and the second supply line 234b branch off from a main supply line 234c. The main supply line 234c receives the heat transfer gas from the heat transfer gas supply source 235 and supplies the heat transfer gas to the first supply line 234a and the second supply line 234b. A first flow rate adjustment member 235a is provided in the first supply line 234a. A second flow rate adjustment member 235b is provided in the second supply line 234b. A controller 700 independently controls the first flow rate adjustment member 235a and the second flow rate adjustment member 235b. The controller 700 controls the first flow rate adjustment member 235a and the second flow rate adjustment member 235b to independently adjust the flow rates per unit area of the heat transfer gas that flows through the first supply line 234a and the second supply line 234b, thereby independently adjusting the pressures of the heat transfer gas that is supplied into the first gas region and the second gas region.

The heating member 225 buried in the dielectric plate 220 will be described with reference to FIGS. 4 and 5. The heating member 225 includes a first heater 225a, a second heater 225b, a third heater 225c, a fourth heater 225d, a fifth heater 225e, a sixth heater 225f, and a seventh heater 225g. When viewed from above, the first heater 225a, the second heater 225b, the third heater 225c, the fourth heater 225d, the fifth heater 225e, the sixth heater 225f, and the seventh heater 225g heat different regions on the substrate W placed on the support member 210.

The dielectric plate 220, when viewed from above, is divided into a first heating region and a second heating region. The first heating region includes the edge of the support member 210. A broken line 226e in FIG. 4 divides the first heating region from the second heating region. A plurality of first heating regions may be provided. The first heating regions may be arranged along the circumferential direction of the substrate W. The first heating region of the support member 210 is divided by broken lines 226a, 226b, 226c, and 226d along the circumferential direction. The second heating region includes the central region of the support member 210. A plurality of second heating regions may be provided. The second heating region may be divided into a plurality of ring-shaped regions that share the center of the support member 210. For example, the second heating region of the support member 210 is divided into ring-shaped regions by broken lines 226f and 226g. In an embodiment, the region partitioned by the broken lines 226e and 226f may be defined as a third heating region, and the region in the broken line 226f may be defined as the second heating region.

In an embodiment, the distance between the center of the support member 210 and the broken line 226g that divides the support member 210 in a ring shape with respect to the center of the support member 210, the distance between the broken line 226e and the broken line 22f, and the distance between the broken line 226f and the broken line 226g may be the same as, or different from, one another.

The first heater 225a, the second heater 225b, the third heater 225c, and the fourth heater 225d are radially arranged along the edge of the support member 210. The first heater 225a, the second heater 225b, the third heater 225c, and the fourth heater 225d are arranged in the first heating region A1, A2, B1, B2, C1, C2, D1, and D2 that includes the edge of the support member 210. The fifth heater 225e, the sixth heater 225f, and the seventh heater 225g are arranged in the second heating region E, F, and G that includes the central region of the support member 210.

The first heater 225a is disposed in the heating region A1-A2. The second heater 225b is disposed in the heating region B1-B2. The third heater 225c is disposed in the heating region C1-C2. The fourth heater 225d is disposed in the heating region D1-D2. The fifth heater 225e is disposed in the heating region E. The sixth heater 225f is disposed in the heating region F. The seventh heater 225g is disposed in the heating region G.

Outputs of the first heater 225a, the second heater 225b, the third heater 225c, the fourth heater 225d, the fifth heater 225e, the sixth heater 225f, and the seventh heater 225g may be independently controlled by the controller 700.

The region A1-A2 in which the first heater 225a is provided may be partitioned into the region A1 and the region A2 by the second protrusion 222b that partitions the gas regions from each other. The region B1-B2 in which the second heater 225b is provided may be partitioned into the region B1 and the region B2 by the second protrusion 222b that partitions the gas regions from each other. The region C1-C2 in which the third heater 225c is provided may be partitioned into the region C1 and the region C2 by the second protrusion 222b that partitions the gas regions from each other. The region D1-D2 in which the fourth heater 225d is provided may be partitioned into the region D1 and the region D2 by the second protrusion 222b that partitions the gas regions from each other. That is, when the support member 210 is viewed from above, each of the heating regions on the substrate W that are heated by the first heater 225a, the second heater 225b, the third heater 225c, and the fourth heater 225d is divided into two regions by at least the second protrusion 222b. The four heating regions in which the first heater 225a, the second heater 225b, the third heater 225c, and the fourth heater 225d are provided are partitioned into a total of eight regions by the second protrusion 222b. In other words, the four regions in which the first heater 225a, the second heater 225b, the third heater 225c, and the fourth heater 225d are provided extend over the first gas region and the second gas region and therefore are partitioned into a total of eight regions.

In an embodiment, among the plurality of heating regions, the heating region A1-A2, the heating region B1-B2, the heating region C1-C2, and the heating region D1-D2 that are located farthest from the center of the support member 210 are divided into a plurality of regions by the second protrusion 222b. Furthermore, the widths of the heating region A1-A2, the heating region B1-B2, the heating region C1-C2, and the heating region D1-D2 in the radial direction of the substrate W are greater than the widths of the heating region E, the heating region F, and the heating region G in the radial direction of the substrate W.

In an embodiment, although the region A1 and the region A2 are heated by the first heater 225a, the region A1 and the region A2 belong to the first gas region and the second gas region, respectively, and therefore the temperatures of the region A1 and the region A2 may be controlled to be different from each other, by differentiating heat transfer rates by supplying the heat transfer gas to the first gas region and the second gas region at different pressures.

According to an embodiment, two or more independently controllable gas regions are superimposed on one heating region, thereby increasing the number of temperature control regions without addition of a heater. Accordingly, a temperature deviation may be improved.

Figure 6:
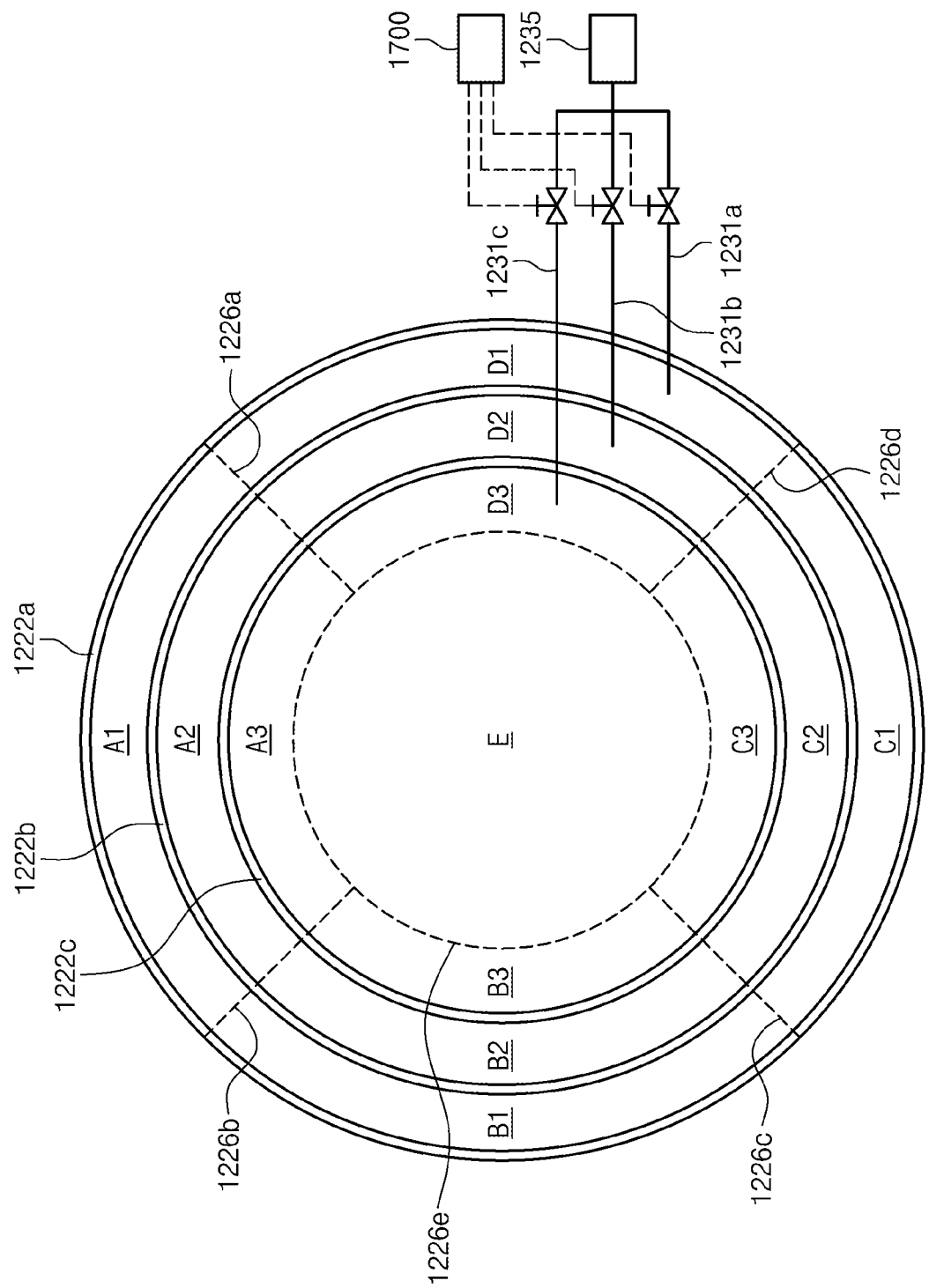
FIG. 6 is a view illustrating temperature control regions by a protrusion and a heat transfer gas supply member according to another embodiment.

FIG. 6 is a view illustrating temperature control regions by a protrusion and a heat transfer gas supply member according to another embodiment.

Referring to FIG. 6, the protrusion includes a first protrusion 1222a in a ring shape that is provided at the edge of the dielectric plate 220, a second protrusion 1222b in a ring shape that has a smaller diameter than the first protrusion 1222a and is provided inward of the first protrusion 1222a, and a third protrusion 1222c in a ring shape that has a smaller diameter than the second protrusion 1222b and is provided closest to the center of the support member 210. The first protrusion 1222a, the second protrusion 1222b, and the third protrusion 1222c are concentric with one another with respect to the center of the support member 210. A first gas region is between the first protrusion 1222a and the second protrusion 1222b, a second gas region is between the second protrusion 1222b and the third protrusion 1222c, and a third gas region is inward of the third protrusion 1222c.

The first gas region, the second gas region, and the third gas region are connected to heat transfer gas supply lines, respectively. The first gas region is connected to a first supply line 1231a that branches off from a main supply line. The second gas region is connected to a second supply line 1231b that branches off from the main supply line. The third gas region is connected to a third supply line 1231c that branches off from the main supply line. The main supply line is connected to a heat transfer gas supply source 1235 and supplies a heat transfer gas to the first to third supply lines 1231a, 1231b, and 1231c. Flow rate adjustment valves are provided in the first supply line 1231a, the second supply line 1231b, and the third supply line 1231c, respectively. A controller 1700 may independently control the flow rate adjustment valves to differentiate the pressures of the heat transfer gas supplied into to the first gas region, the second gas region, and the third gas region.

A heating region is partitioned into a heating region E, a heating region A1-A3, a heating region B1-B3, a heating region C1-C3, and a heating region D1-D3. The heating region E contains the center of the support member 210 and is defined by a broken line 1226e in a ring shape that has a smaller diameter than the third protrusion 1222c. The heating regions A1-A3, B1-B3, C1-C3, and D1-D3 are defined by the broken line 1226e and broken lines 1226a, 1226b, 1226c, and 1226d that extend from the edge of the support member 210 toward the center of the support member 210 and that are arranged in the circumferential direction. The heating region A1-A3 is defined by the broken lines 1226a and 1226b and the broken line 1226e, the heating region B1-B3 is defined by the broken lines 1226b and 1226c and the broken line 1226e, the heating region C1-C3 is defined by the broken lines 1226c and 1226d and the broken line 1226e, and the heating region D1-D3 is defined by the broken lines 1226d and 1226a and the broken line 1226e. Outputs of heaters provided in the respective heating regions may be independently controlled.

The heating region is partitioned into the five heating regions. Among the five heating regions, the heating region A1-A3, the heating region B1-B3, the heating region C1-C3, and the heating region D1-D3 are superimposed on the first gas region, the second gas region, and the third gas region. Accordingly, the heating region A1-A3 is divided into a region A1, a region A2, and a region A3. The heating region B1-B3 is divided into a region B1, a region B2, and a region B3. The heating region C1-C3 is divided into a region C1, a region C2, and a region C3. The heating region D1-D3 is divided into a region D1, a region D2, and a region D3.

According to the embodiment of FIG. 6, the thirteen regions may be independently controlled by using the five heating regions and the three gas regions.

The shape of the protrusion is not limited to that in the embodiment disclosed. For example, the protrusion 222 may be provided in a shape that divides a substrate into fan-shaped regions. That is, gas regions may be formed in a fan shape.

According to the embodiments of the inventive concept, the substrate treating apparatus may improve process efficiency in treating a substrate using plasma.

Furthermore, according to the embodiments, the substrate treating apparatus may further subdivide and heat a substrate.

In addition, according to the embodiments, the substrate treating apparatus may improve a temperature deviation using small heating regions.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a housing having a process space therein;
   a support unit configured to support the substrate in the process space;
   a process gas supply unit configured to supply a process gas into the process space; and
   a plasma source configured to generate plasma from the process gas,
   wherein the support unit comprises:
      a support member on which the substrate is placed;
      a heating member configured to heat the substrate supported on the support member; and
      a heat transfer gas supply member configured to supply a heat transfer gas to a backside of the substrate supported on the support member,
   wherein the heating member comprises a plurality of heaters, wherein the plurality of heaters heat different regions on the substrate placed on the support member when viewed from above, wherein the support member comprises a protrusion configured to partition a space between the support member and the backside of the substrate placed on the support member into a plurality of gas regions, and wherein at least one of heating regions on the substrate heated by the heating member is divided into a plurality of regions by the protrusion when viewed from above, and wherein outputs of the plurality of heaters are independently controllable.

2. The apparatus of claim 1, wherein pressures of the heat transfer gas supplied into the plurality of gas regions are independently adjustable.

3. The apparatus of claim 1, wherein the heat transfer gas supply member comprises:
a heat transfer gas supply source;
a main supply line connected to the heat transfer gas supply source;
a plurality of supply channels branching off from the main supply line, each of which is connected to a corresponding one of the plurality of gas regions; and
flow rate adjustment members installed in the respective supply channels, each of the flow rate adjustment members being configured to adjust a flow rate of the heat transfer gas flowing through the corresponding supply channel.

4. The apparatus of claim 1, wherein the protrusion has a ring shape.

5. The apparatus of claim 4, wherein some of the plurality of heating regions are at different distances from the center of the support member.

6. The apparatus of claim 1, wherein the heating region divided into the plurality of regions by the protrusion when viewed from above is a heating region located farthest from the center of the support member among the plurality of heating regions.

7. The apparatus of claim 1, wherein the plurality of heating regions include:
a first heating region including an edge region of the support member; and
a second heating region including a central region of the support member, and
wherein the heating region divided into the plurality of regions by the protrusion when viewed from above is the first heating region.

8. The apparatus of claim 7, wherein the first heating region comprises a plurality of first heating regions, and
wherein the plurality of first heating regions are arranged along a circumferential direction of the substrate.

9. The apparatus of claim 7, wherein the plurality of heating regions further include a third heating region disposed between the first heating region and the second heating region.

10. The apparatus of claim 7, wherein the first heating region has a larger width along a radial direction of the substrate than the second heating region.

11. The apparatus of claim 7, wherein the plurality of heating regions include:
a central gas region including part of the first heating region and part of the second heating region; and
an edge gas region including another part of the first heating region.

12. A support unit for supporting a substrate, the support unit comprising:
a support member on which the substrate is placed;
a heating member configured to heat the substrate supported on the support member; and
a heat transfer gas supply member configured to supply a heat transfer gas to a backside of the substrate supported on the support member,
wherein the heating member comprises a plurality of heaters,
wherein the plurality of heaters heat different regions on the substrate placed on the support member when viewed from above,
wherein the support member comprises a protrusion configured to partition a space between the support member and the backside of the substrate placed on the support member into a plurality of gas regions, and
wherein at least one of heating regions on the substrate heated by the heating member is divided into a plurality of regions by the protrusion when viewed from above, and
wherein outputs of the plurality of heaters are independently controllable.

13. The support unit of claim 12, wherein pressures of the heat transfer gas supplied into the plurality of gas regions are independently adjustable.

14. The support unit of claim 12, wherein the plurality of heating regions include:
a first heating region including an edge region of the support member; and
a second heating region including a central region of the support member, and
wherein the heating region divided into the plurality of regions by the protrusion when viewed from above is the first heating region.

15. The support unit of claim 14, wherein the plurality of heating regions include:
a central gas region including part of the first heating region and part of the second heating region; and
an edge gas region including another part of the first heating region.

* * * * *